Figure 1:
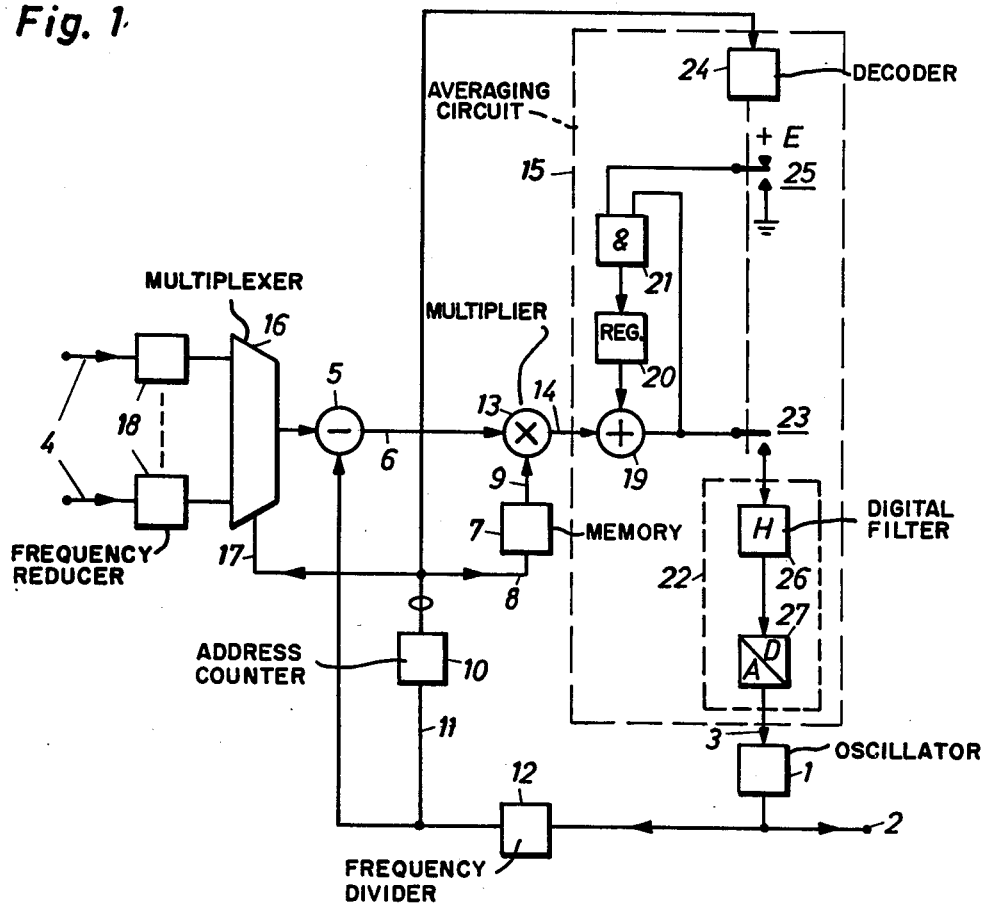

United States Patent [19]

Ghisler et al.

[11] 4,075,428
[45] Feb. 21, 1978

[54] DEVICE FOR PROVIDING PHASE SYNCHRONISM OF A TRANSIT STATION IN A DIGITAL TELECOMMUNICATION NETWORK

[75] Inventors: Walter Ghisler, Upplands-Vasby; Aleksander Marlevi, Saltsjo-Boo; Johan Olof Ånäs, Huddinge, all of Sweden

[73] Assignee: Telefonaktiebolaget L M Ericsson, Stockholm, Sweden

[21] Appl. No.: 782,043

[22] Filed: Mar. 28, 1977

[30] Foreign Application Priority Data

Apr. 27, 1976 Sweden ............................... 7604797

[51] Int. Cl.² .............................................. H04J 3/06
[52] U.S. Cl. .............................................. 179/15 BS
[58] Field of Search .................................... 179/15 BS

[56] References Cited

U.S. PATENT DOCUMENTS

| 3,504,126 | 3/1970 | Inose et al. | 179/15 BS |
| 3,869,579 | 3/1975 | Karl | 179/15 BS |
| 4,025,720 | 5/1977 | Pachynski, Jr. | 179/15 BS X |

*Primary Examiner*—Thomas W. Brown
*Attorney, Agent, or Firm*—Hane, Roberts, Spiecens & Cohen

[57] ABSTRACT

A device for providing phase synchronism of a transit station in a digital telecommunication network, comprising within a phase-locked loop a voltage-controlled oscillator that has an output arranged to supply a station clock signal and a control input actuated by line clock signals pertaining to a plurality of incoming lines from other transit stations in the telecommunication network and a phase comparator that is arranged to compare the phase of the station clock signal with the phases of the line clock signals and has an output connected to the control input of the voltage-controlled oscillator via a loop filter. The loop filter comprises a memory means that has an address input and a read output and is arranged to store selected weighting coefficients for the line clock signals, and address counter means that has an input connected to the output of the voltage-controlled oscillator and an output arranged for cyclically reading out address words assigned to said incoming lines and being connected to the address input of the memory means, and a multiplier means that has a first input connected to the output of the phase comparator, a second input connected to the read output of the memory means and an output connected to the control input of the voltage-controlled oscillator via an averaging means, a time multiplex stage being connected between said incoming lines and the phase comparator and having an address input connected to the output of the address counter means.

1 Claim, 2 Drawing Figures

DEVICE FOR PROVIDING PHASE SYNCHRONISM OF A TRANSIT STATION IN A DIGITAL TELECOMMUNICATION NETWORK

The invention relates to a device for providing phase synchronism of a transit station in a digital telecommunication network, comprising within a phase-locked loop a voltage-controlled oscillator that has an output arranged to supply a station clock signal and a control input capable of being actuated upon by line clock signals pertaining to a plurality of incoming lines from other transit stations in the telecommunication network and a phase comparator that is arranged to compare the phase of the station clock signal with the phases of the line clock signals and has an output connected to the control input of the voltage controlled oscillator via a loop filter.

A device for providing phase synchronism of a transit station in a digital telecommunication network is described in the Swedish Pat. No. 7,212,945-5 which also gives a summary of the prior art. In this known synchronization device a phase-locked loop comprises a phase comparator consisting of a number of flip-flops arranged to provide phase comparison signals for a station clock signal from a voltage controlled oscillator and line clock signals pertaining to a plurality of incoming lines from other transit stations in the telecommunication network. The phase comparison signals are arranged to influence a control input of the voltage controlled oscillator after that they first have been combined via a respective resistor in an averaging network.

The line clock signals pertaining to a plurality of incoming lines from different transit stations in a telecommunication network show, however, rarely the same stability and, furthermore, the stability can vary in time for one and the same line clock signal. A countermeasure is to utilize different resistances of the resistors in the averaging network in the known synchronization device. It is, however, a difficulty that these resistances may need to be changed frequently.

The invention is based on the knowledge of said problem of stability and provides for its solution means which make it easy to frequently change said averaging.

Figure 2:
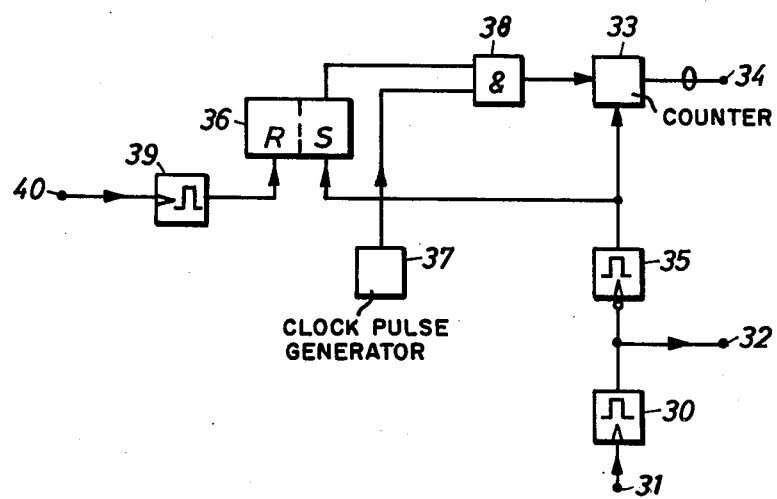

The invention the characterizing features of which appear from the appended claims will now be explained more in detail with reference to the accompanying drawing where FIG. 1 shows a block diagram of a preferred embodiment of the device according to the invention for providing phase synchronism of a transit station in a digital telecommunication network and FIG. 2 shows a logic diagram of a digital phase comparator which is included in the device in FIG. 1.

FIG. 1 shows a block diagram of a preferred embodiment of the device according to the invention for providing phase synchronism of a transit station in a digital telecommunication network. The device includes within a phase locked loop a voltage controlled oscillator 1 which has an output 2 arranged to supply a station clock signal and a control input 3 capable of being actuated upon by line clock signals pertaining to a plurality of incoming lines 4 from other transit stations in the telecommunication network and a phase comparator 5 which is arranged to compare the phase of the station clock signal with the phases of the line clock signals and has an output 6 connected to the control input 3 of the voltage controlled oscillator 1 via a loop filter.

The loop filter comprises according to the invention a memory 7 which has an address input 8 and a read output 9 and is arranged to store selected weighting coefficients for the line clock signals, an address counter 10 which has an input 11 connected to the output 2 of the voltage controlled oscillator 1 via a frequency divider 12 and an output that is arranged for a cyclical read out of address words allotted said incoming lines 4 and is connected to the address input 8 of the memory 7, and a multiplier 13 which has a first input connected to the output 6 of the phase comparator 5, a second input connected to the read output 9 of the memory 7 and an output 14 connected to the control input 3 of the voltage controlled oscillator 1 via an averaging circuit 15, a time multiplexer stage 16 being connected between said incoming lines 4 and the phase comparator 5 and having an address input 17 connected to the output of the address counter 10. The line clock signals are reduced in frequency in correspondence to the reduction in frequency of the station clock signal by means of the frequency divider 12, the incoming lines 4 for this purpose being provided with a respective frequency reducer 18 which according to the example is constituted by a synchronizing word detector.

In the averaging circuit 15 the product result from the multiplyer 13 is applied to an arithmetic unit 19 which adds it to an accumulated product sum in a register 20 and after that writes a new accumulated product sum in the register 20 via an AND-gate 21. The accumulated product sum which is obtained from the arithmetic unit 19 after N summations where N is equal to the number of incoming lines 4 is further fed to a filter block 22 via a sampling contact 23 controlled by the address counter 10 via a decoder 24, the register 20 simultaneously being reset thereby that the writing from the arithmetic unit 19 is inhibited by means of an inhibiting contact 25 connected to a control input of the AND-gate 21 and controlled by the decoder 24 in synchronism with the sampling contact 23.

The filter block 22 consists according to the example of a digital filter 26 followed by a digital-to-analog converter 27. In the Swedish Pat. No. 369,012 a suitable embodiment of the filter 26 is described which makes it easy to change its transfer function H for example in correspondence to a decision that the averaging in the circuit 15 will not be made with respect to N product terms where N is equal to the number of incoming lines 4 but with respect to N-P product terms produced by the multiplier 13. The symbol P denotes here a number of incoming lines 4 which are disregarded with respect to their line clock signals, their pertaining weighting coefficients stored in the memory 7 being given the value zero. The decision can be motivated by the fact that the phase stability of the line clock signals on said P incoming lines 4 have deteriorated so much relatively the phase stability of the line clock signals on the other incoming lines 4 that only a reduction of their weighting coefficients are not a sufficient counter-measure. Two special cases ought especially to be mentioned, namely when N-P is set equal to 1 in order to that the station clock signal shall be slaved to a selected line clock signal and when N-P is set equal to 0, the station clock signal then becoming asynchronous relatively the line clock signals. In digital telecommunication system it is essential that all these alternatives are accessible and they are according to the invention provided by changes of the weighting coefficients stored in the memory 7 and, if required, changes of the transfer function H in the digital filter 26. All these changes are simply carried out by a replacement of a digital memory content which can be accomplished in a manual or an automatic way in a manner known per se.

FIG. 2 shows a logic diagram of the phase comparator 5 in the device in FIG. 1. An edge triggered monostable flip-flop 30 has an input 31 arranged to be fed with said frequency reduced station clock signal and to react on the leading edge of this by supplying on an outout 32 a pulse of a short duration for activation of the multiplier 13 and the averaging circuit 15, a counter result in a counter 33 being read to the multiplier 13 via an output 34 of the counter 33. A second edge triggered monostable flip-flop 35 is connected in cascade with the monostable flip-flop 30 and is arranged to react on the trailing edge of the pulse on the output 32 by supplying a pulse of a short duration to a reset input of the counter 33 and to a set input of a bistable flip-flop 36.

The counter 33 has a clock input arranged to be fed with high frequency pulses from a clock pulse generator 37 via an AND-gate 38 activated by the bistable flip-flop 36. A third edge triggered monostable flip-flop 39 has an input 40 arranged to be fed with sid frequency reduced line clock pulses from the time mulitplexor stage 16 and to react on the leading edge of these by supplying a pulse of a short duration to a rest input of the bistable flip-flop 36, the activation of the AND-gate 38 being ceased and the counter 33 being stopped. The counter result of the latter constitutes a digital phase comparison signal in which the number of digit positions are determined by the capacity of the counter 33 and by the frequency of the clock pulse generator 37. This can suitably be constituted by a frequency multiplier that is fed with a station clock signal from the output 2 of the voltage controlled oscillator 1 in FIG. 1.

The invention is not limited to the described embodiment but can be modified in many ways within the scope of the appended claims. It is for example in principle nothing that prohibits the digital operations of the phase comparator 5, the multiplier 13, the memory 7 and the averaging circuit 15 from being replaced by corresponding analog operations. It should be pointed out that the invention is suitable also for a so called double side synchronization described for example in the Swedish Pat. No. 7,212,945-5, in which case, however, a further time mutiplexor stage is required to receive phase comparison signals from the other transit stations in the telecommunication network and to be controlled by the address counter 10 and a further arithmetical means is required to subtract the received phase comparison signals from their associated phase comparison signal produced by the phase comparator 5. Eventually, intermediate storage means are required for the received phase comparison signals.

We claim:

1. Device for providing phase synchronism of a transit station in a digital telecommunication network, comprising within a phase-locked loop a voltage-controlled oscillator that has an output arranged to supply a station clock signal and a control input capable of being actuated upon by line clock signals pertaining to a plurality of incoming lines from other transit stations in the telecommunication network and a phase comparator that is arranged to compare the phase of the station clock signal with the phases of the line clock signals and has an output connected to the control input of the voltage controlled oscillator via a loop filter, wherein the loop filter comprises a memory means which has an address input and a read output and is arranged to store selected weighting coefficients for the line clock signals, an address counter means which has an input connected to the output of the voltage-controlled oscillator and an output arranged for a cyclical read out of address words allotted to said incoming lines and connected to the address input of the memory means, and a multiplier means which has a first input connected to the output of the phase comparator, a second input connected to the read output of the memory means and an output connected to the control input of the voltage-controlled oscillator via an averaging means, a time multiplexor stage being connected between said incoming lines and the phase comparator and having an address input connected to the output of the address counter means.

* * * * *